(12) United States Patent
Huang

(10) Patent No.: US 10,509,496 B2
(45) Date of Patent: Dec. 17, 2019

(54) TOUCH DRIVING CIRCUIT, TOUCH PANEL AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Fei Huang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/765,415

(22) PCT Filed: Oct. 12, 2017

(86) PCT No.: PCT/CN2017/105824
§ 371 (c)(1),
(2) Date: Apr. 2, 2018

(87) PCT Pub. No.: WO2018/176795
PCT Pub. Date: Oct. 4, 2018

(65) Prior Publication Data
US 2019/0073068 A1    Mar. 7, 2019

(30) Foreign Application Priority Data
Mar. 31, 2017   (CN) .......................... 2017 1 0210136

(51) Int. Cl.
*G06F 3/041*   (2006.01)
*H03K 17/96*   (2006.01)
(Continued)

(52) U.S. Cl.
CPC .......... *G06F 3/0412* (2013.01); *G06F 3/0416* (2013.01); *H03K 17/96* (2013.01);
(Continued)

(58) Field of Classification Search
None
See application file for complete search history.

(56) References Cited

U.S. PATENT DOCUMENTS

2005/0083768 A1\* 4/2005 Hara ..................... G06K 9/0002
                                                        365/232
2016/0224175 A1\* 8/2016 Moon ................... G06F 3/0412
2017/0003807 A1   1/2017 Abe

FOREIGN PATENT DOCUMENTS

CN   102831867 A   12/2012
CN   103823589 A    5/2014
(Continued)

OTHER PUBLICATIONS

International Search Report and Written Opinion for International Appl. No. PCT/CN2017/105824, dated Dec. 27, 2017.
(Continued)

*Primary Examiner* — Brian M Butcher
(74) *Attorney, Agent, or Firm* — Foley & Lardner LLP; James F. Ewing; Paul M. H. Pua

(57) ABSTRACT

The present disclosure relates to a touch driving circuit, a touch panel and a display device. A touch driving circuit, comprising: an input subcircuit, configured to receive an input signal which scans forward or backward; a shift register subcircuit, configured to shift register the input signal to generate an output control signal; an enable signal input subcircuit, configured to control an output of the output enable signal of the integrated circuit according to the output control signal; and an output subcircuit, configured to output a corresponding output signal according to the output
(Continued)

enable signal. An embodiment of the present disclosure realizes the touch driving circuit with reduced usage of the integrated circuit.

9 Claims, 3 Drawing Sheets

(51) Int. Cl.
*H03K 19/20* (2006.01)
*G09G 3/20* (2006.01)

(52) U.S. Cl.
CPC ............... *H03K 19/20* (2013.01); *G09G 3/20* (2013.01); *G09G 2354/00* (2013.01)

(56) References Cited

FOREIGN PATENT DOCUMENTS

| | | |
|---|---|---|
| CN | 104360781 A | 2/2015 |
| CN | 104834427 A | 8/2015 |
| CN | 105741739 A | 7/2016 |
| CN | 105788509 A | 7/2016 |
| CN | 106201111 A | 12/2016 |
| CN | 106959782 A | 7/2017 |

OTHER PUBLICATIONS

First Office Action for CN Appl. No. 201710210136.9, dated Feb. 26, 2019.

* cited by examiner

US 10,509,496 B2

TOUCH DRIVING CIRCUIT, TOUCH PANEL AND DISPLAY DEVICE

CROSS-REFERENCE TO RELATED APPLICATIONS

This application is a U.S. National Stage under 35 U.S.C. § 371 of PCT/CN2017/105824, filed on Oct. 12, 2017, which claims priority to Chinese Patent Application No. 201710210136.9, filed on Mar. 31, 2017, the contents of which are hereby incorporated by reference in their entirety for all purposes.

TECHNICAL FIELD

The present disclosure relates to a touch driving circuit, a touch panel and a display device.

BACKGROUND

With the continuous development of mobile devices, interactions between human and machine has been developed from the original mechanical button to the current touch sensing. During interactions between human and machines in the touch sensing mode, the touch driving circuit plays a very important role.

SUMMARY

A summary of the subject matter of present disclosure is provided below. This summary is not intended to limit the scope of protection of the claims.

According to some embodiments of the present disclosure, a touch driving circuit is provided, including an input subcircuit, configured to receive an input signal which scans forward or backward;

a shift register subcircuit, configured to shift register the input signal to generate an output control signal;

an enable signal input subcircuit, configured to control an output of an output enable signal of an integrated circuit according to the output control signal; and an output subcircuit, configured to output a corresponding output signal according to the output enable signal.

Optionally, the input subcircuit may comprise:

a first transmission gate for receiving the input signal which scans forward; and a second transmission gate for receiving the input signal which scans backward.

Optionally, the input subcircuit may be configured to transmit the input signal which scans forward via the first transmission gate in case of forward scanning; and transmit the input signal which scans backward via the second transmission gate in case of backward scanning, wherein the input signal is effective at a low electric level.

Optionally, the shift register subcircuit may comprise a first group of NAND gates and a second group of NAND gates that are connected in an end-to-end fashion.

Optionally, the first group of NAND gates comprises a first NAND gate and a second NAND gate, the second group of NAND gates comprises a third NAND gate and a fourth NAND gate, an input end of the first NAND gate is connected to a clock signal, another input end of the first NAND gate is connected to an output end of the second NAND gate, an output end of the first NAND gate is connected to an input end of the second NAND gate, an input end of the fourth NAND gate and an output end of the shift register subcircuit, another input end of the second NAND gate is connected to an output end of the fourth NAND gate and an input end of the third NAND gate, another input end of the third NAND gate receives the input signal outputted from the input subcircuit, and an output end of the third NAND gate is connected to another input end of the fourth NAND gate.

Optionally, the enable signal input subcircuit may comprise: a third transmission gate, an N-type metal oxide transistor and an inverter, wherein the inverter controls the N-type metal oxide transistor according to an output control signal output from the shift register subcircuit, an output of the third transmission gate is pulled down to a negative electric source pin (VGL) of a low electric level liquid crystal display (LCD) screen when the N-type metal oxide transistor turns on.

Optionally, the enable signal input subcircuit is configured to control a close state and an open state of the third transmission gate according to the output control signal output from the shift registered subcircuit and processed by the inverter; and to control the output enable signal of an integrated circuit based on the open state or the close state of the third transmission gate.

Optionally, the output subcircuit comprises four inverters, a fifth transmission gate, a fifth transmission gate and an AND gate.

Optionally, the output subcircuit is configured to perform AND operation on the output enable signal and an integrated circuit signal via the AND gate, when the output enable signal is at high electric level, the output signal is output, and when the output enable signal is at low electric level, a reference voltage signal for deflection of liquid crystal molecules is output.

According to some further embodiments of the present disclosure, a touch panel is provided which comprises the above touch driving circuit.

According to some still further embodiments of the present disclosure, a display device is provided which comprises the above touch panel.

Other features and advantages of the present disclosure will be described below, and become clear partly from the specification, or become understandable by implementing the present application. The purpose and other advantages of the present disclosure can be realized and obtained by the specific structure as indicted in the specification, claims and drawings.

BRIEF DESCRIPTION OF THE DRAWINGS

The drawings are provided to help further understanding of the technical solutions of the present disclosure, and consists a part of the specification. The drawings can explain the technical solutions of the present disclosure together with the embodiments of the present disclosure, and does not intend to limit the technical solutions of the present disclosure.

DETAILED DESCRIPTION

Figure 1:
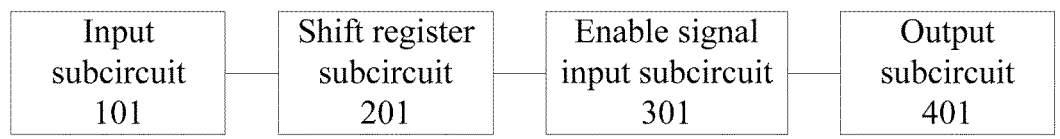
FIG. 1 is a structural diagram of the touch driving circuit according to some embodiments of the present disclosure.

In order to make the purpose, technical solutions and advantages of the present disclosure clear, embodiments of the present disclosure will be described in detail in combination of the drawing. It should be understood that the embodiments and features in the embodiments can be combined at will as long as there is no contradiction.

The steps shown in the flow chart of the drawings can be carried out by a group of computer executable instructions in a computer system. Although logical sequences have been shown in the flow chart, the steps may be carried out in different sequences in certain situations.

FIG. 1 shows a structural diagram of the touch driving circuit according to an embodiment of the present disclosure. As shown in FIG. 1, the touch driving circuit includes: an input subcircuit 101, a shift register subcircuit 201, an enable signal input subcircuit 301 and an output subcircuit 401.

The input subcircuit 101 is configured to input an input signal which scans forward or backward.

Optionally, the input subcircuit 101 according to the embodiment of the present disclosure comprises a first transmission gate 1-1 and a second transmission gate 1-2.

It should be noted that the above components of the input subcircuit is just an optional embodiment of the present disclosure. Any input circuit structure that can realize the forward scanning input signal and backward scanning input signal may be applied in the embodiments of the present disclosure.

Optionally, the input subcircuit 101 may be configured to

Transmit forward scanning input signals via the first transmission gate 1-1 in case of forward scanning; and Transmit backward scanning input signals via the second transmission gate 1-2 in case of backward scanning.

The input signal is valid in a low level.

It should be noted that the input signal is valid in the low level according to the embodiments of the present disclosure. This may effectively lower the power consumption of the touch driving circuit.

The shift register subcircuit 201 is configured to shift register the input signal to generate an output control signal.

Optionally, the shift register subcircuit according to an embodiment of the present disclosure consists of two groups of NAND gates that are connected in an end-to-end fashion. In an optional example, the first group of the NAND gate comprises a first NAND gate 2-1 and a second NAND gate 2-2, and the second group of the NAND gate comprises a third NAND gate 2-3 and a fourth NAND gate 2-4.

The enable signal input subcircuit 301 is configured to control output of an output enable signal of an integrated circuit by controlling a level of an output control signal.

Optionally, the enable signal input subcircuit 301 according to the embodiment of the present disclosure comprises a third transmission gate 3-1, an N type metal oxide transistor 3-2 and an inverter 3-3. The inverter 3-3 controls the N type metal oxide transistor 3-2 on and off according to the output control signal from the shift register subcircuit 201. The output of the third transmission gate 3-1 is pulled down to negative electrical source input pin (VGL) of a low electric level LCD screen when the N type metal oxide transistor 3-2 is on.

Optionally, the enable signal input subcircuit 301 is configured to control the third transmission gate 3-1 on and off according to the output control signal output from the shift register subcircuit 201, the output control signal is processed by the inverter 3-3 before being used to control the on and off of the third transmission gate 3-1. The electric level of the output enable signal of the integrated circuit is controlled, by the third transmission gate 3-1, to be high or low.

The output subcircuit 401 is configured to output a corresponding output signal according to the electric level of the output enable signal.

Optionally, the output subcircuit 401 according to an embodiment of the present disclosure comprises four inverters, a fourth transmission gate 4-1, a fifth transmission gate 4-2 and an AND gate 4-3. The four inverters includes a first inverter 4-4-1, a second inverter 4-4-2, a third inverter 4-4-3, and a fourth inverter 4-4-4.

Optionally, the output subcircuit 401 according to the embodiment of the present disclosure may be configured to Perform AND operation on the output enable signal and a signal from the integrated circuit. When the output enable signal is at high level, the output subcircuit 401 output the output signal, and when the output enable signal is at low level, the output subcircuit 401 output a reference level (VCOM) signal for deflection of the liquid crystal molecules.

According to the embodiment of the present disclosure, a part of the work that originally be performed within the integrated circuit is transferred to the display screen after the AND operation on the output enable signal and the signal from the integrated circuit. Thus, the usage rate of the integrated circuit is lowered.

Compared with related arts, the technical solution according to an embodiment of the present disclosure comprises an input subcircuit, a shift register subcircuit, an enable signal input subcircuit and an output subcircuit. The input subcircuit is configured to input an input signal that scans forward or backward. The shift register subcircuit is configured to shift register the input signal to generate an output control signal. The enable signal input subcircuit is configured to control an output of the output enable signal from the integrated circuit according to the electric level of the output control signal. The output subcircuit is configured to output a corresponding output signal according to the electric level of the output enable signal. The present disclose realizes a touch driving circuit with the usage of the integrated circuit reduced.

Figure 2:
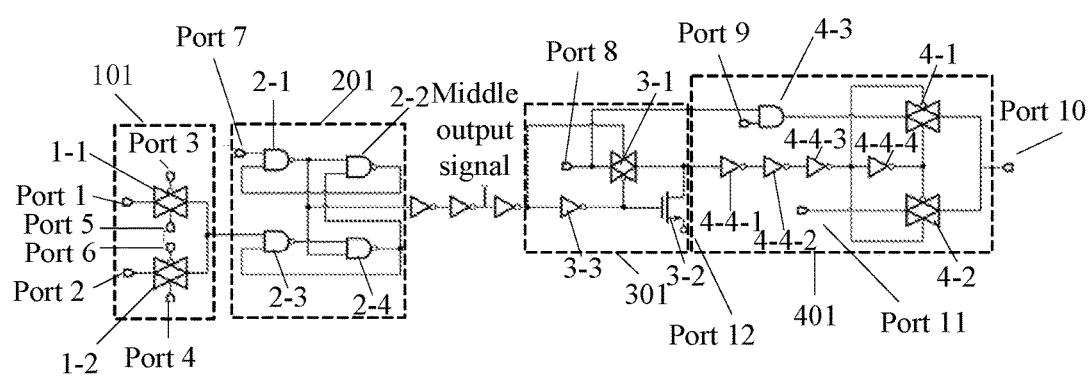
FIG. 2 is a principle diagram of the touch driving circuit according to some optional embodiments of the present disclosure.

FIG. 2 is a principle diagram of the touch driving circuit according to an optional embodiment of the present disclosure. As shown in FIG. 2, the input subcircuit comprises a first transmission gate 1-1 and a second transmission gate 1-2. In case of forward scanning, an input signal that scans forward is transmitted via port 1 of the first transmission gate 1-1. In case of backward scanning, an input signal that scans backward is transmitted via port 2 of the second transmission gate 1-2. During forward scanning, the input signal transmitted by the first transmission gate 1-1 is effective at low electric level. During backward scanning, the input signal transmitted by the second transmission gate 1-2 is effective at low electric level. In the input subcircuit 101, port 3, port 4, port 5 and port 6 transmit DC electric signals of high and low levels. Specifically, the signals input from the port 3 and port 4 are the same, and the signals input from the port 5 and port 6 are the same. In case of forward scanning, the electric levels of port 3 and port 4 are both low, and the electric levels of port 5 and port 6 are both high. In case of backward scanning, the electric levels of port 3 and port 4 are both high, and the electric levels of port 5 and port 6 are both low.

The shift register subcircuit 201 is consisted by two groups of NAND gates connected in an end-to-end fashion. The shift register subcircuit 201 is configured to shift register the input signal to generate an output control signal. The shift register subcircuit 201 may comprise a first NAND gate 2-1, a second NAND gate 2-2, a third NAND gate 2-3 and a fourth NAND gate 2-4. A first input port of the first NAND gate 2-1 is port 7 which receives a first clock signal. A second input port of the first NAND gate 2-1 is connected to the output port of the second NAND gate 2-2 to receive signals output from the output port of the second NAND gate 2-2. A first input port of the second NAND gate 2-2 is connected to an output port of the first NAND gate 2-1 to receive signals output from the first NAND gate 2-1. A second input port of the second NAND gate 2-2 is connected to the output port of the fourth NAND gate 2-4 to receive signals output from the fourth NAND gate 2-4. A first input port of the third NAND gate 2-3 is connected to the input subcircuit 101. A second input port of the third NAND gate 2-3 is connected to the output port of the fourth NAND gate 2-4 to receive signals output from the fourth NAND gate 2-4. A first input port of the fourth NAND gate 2-4 is connected to the output port of the first NAND gate 2-1 to receive signals output from the output port of the first NAND gate 2-1. The second input port of the fourth NAND gate 2-4 is connected to the output port of the third NAND gate 2-3 to receive signals output from the output port of the third NAND gate 2-3. The NAND gate is a basic logic circuit of the digital circuits. In case the inputs are both at high level, the output is at low level. In case at least one of the inputs is at low level, the output is at high level. An NAND gate can be deemed as a combination of an AND gate and a NOT gate. A first clock signal is input from port 7. Assuming the first clock signal is TP_CK, and a multi-stage connection is adopted by the display screen according to the driving circuit. The next stage uses a second clock signal (TP_CKB) which is inverse to the first clock signal. The first clock signal and the second clock signal are used alternatively. The above touch driving circuit according to the embodiment of the present disclosure may be adopted as the current stage of touch driving circuit. In the current stage of touch driving circuit, three inverters are serially connected between the shift register subcircuit 201 and the enable signal input subcircuit 301. The output signal from the shift register subcircuit 201 is inversed three times to boost the driving ability of the signal (maintaining the voltage and increasing the current). The signal after passing the first two inverters is defined as middle output signal (STV_OUT) which will be provided to the port 1 of the input subcircuit of the next stage of driving circuit. Signal from the third inverter will be input to the enable signal input subcircuit 301. The output of the current stage of touch driving circuit is OUT1, and the output of the next stage of touch driving circuit is OUT2. The first clock signal is input to the port 7 of the current stage of touch driving circuit, and the second clock signal is input of the port 7 of the next stage of touch driving circuit. Input signals for other ports are similar. Later stages are alternatively connected in the above manner.

The enable signal input subcircuit 301 comprises a third transmission gate 3-1, an N-type metal oxide transistor 3-2 and an inverter 3-3. The enable signal input subcircuit 301 is configured to control the output of the output enable signal (abbreviated as EXVCOM in the embodiments of the present disclosure) by the electric level of the output control signal. The output enable signal is input from port 8 of the third transmission gate 3-1. Output signal from the shift register subcircuit 201 which has been inversed for three times is electrically connected to the input end of the inverter 303. The output end of the inverter 3-3 is electrically connected to the gate of the N-type metal oxide transistor 3-2. The drain of the metal oxide transistor 3-2 is electrically connected to the output end of the third transmission gate 3-1. The source (i.e. port 12) of the N-type metal oxide transistor 3-2 is electrically connected to the negative source input pin (VGL) of the low electric level LCD screen. Thus, the inverters will control the N-type metal oxide semiconductor transistor according to the output control signals output from the shift register subcircuit. In case the signal which has been inversed by the inverter 3-3 is at high level, the N-type metal oxide transistor (NMOS) 3-2 is on, and the output from the enable signal input subcircuit 301 (i.e. output of the third transmission gate 3-1) is pull down to the negative electrical source input pin (VGL) of a low electric level LCD screen.

The output subcircuit 401 samples a selected output signal according to the output enable signal. The reference voltage (VCOM) signal for deflection of the liquid crystal molecules in an embodiment of the present disclosure is the same to the reference voltage (VCOM) signal for deflection of the liquid crystal molecules in related arts. In case the output enable signal is at a high level, the output signal is output. In case the output enable signal is at a low level, the reference voltage (VCOM) signal for deflection of the liquid crystal molecules is output.

Figure 3:
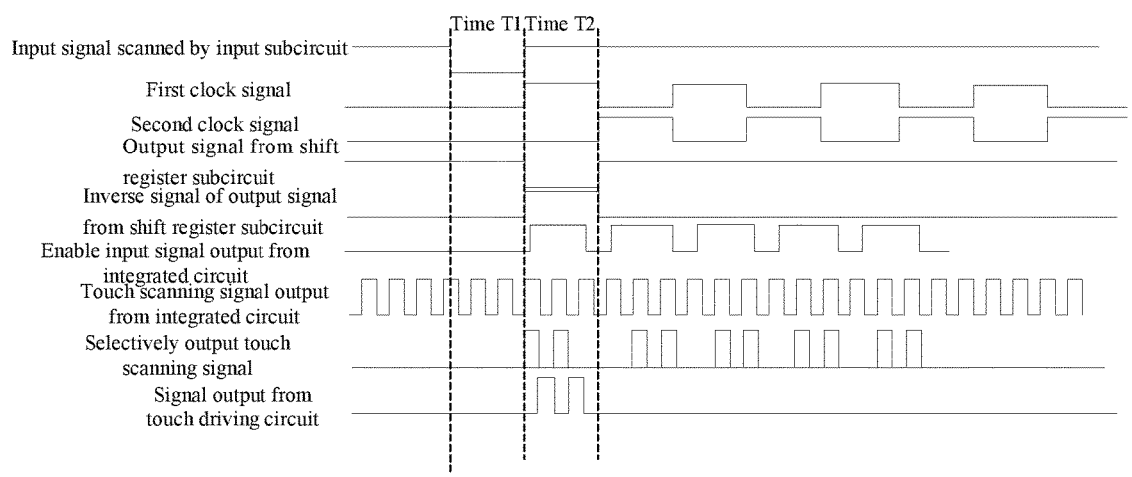
FIG. 3 is a schematic diagram showing timing information according to some embodiments of the present disclosure.

FIG. 3 is a schematic diagram of the timing information according to an embodiment of the present disclosure. As shown in FIG. 3, it comprises timing of the input signal (i.e. the input signal scanned by the input subcircuit in FIG. 3), timing of the inverse signal of the output control signal (i.e. the inverse signal of the output signal of the shift register subcircuit in FIG. 3), timing of the reference voltage signal for deflection of the liquid crystal molecules output from the integrated circuit (enable input signal output from the integrated circuit in FIG. 3), timing of the output enable signal (i.e. touch scanning signal output from the integrated circuit in FIG. 3), timing of the output signal (touch scanning signal selectively output in FIG. 3), and timing of the driving signal output from the driving circuit (i.e. the signal output from the touch driving circuit in FIG. 3).

In an embodiment of the present disclosure, the enable output signal and the reference voltage signal for deflection of the liquid crystal molecules output from the integrated circuit is input from the integrated circuit. The reference voltage signal for deflection of the liquid crystal molecules output from the integrated circuit is a sample signal which has a far great frequency than that of the enable output signal. The output signal is the reference voltage signal for deflection of the liquid crystal molecules output from the integrated circuit which is selected by the enable output signal.

At time T1, the input signal is transmitted to the first input port of the third NAND gate 2-3 of the shift register subcircuit 201 via the first transmission gate 1-1 or the second transmission gate 1-2. The output of the third NAND gate 2-3 is at a high level. A first input end (i.e. port 7) of the first NAND gate 2-1 receives the first clock signal. The output port of the first NAND gate 2-1 is at a high level, and the output of the shift register subcircuit 201 is at a high level. The middle output signal (STV_OUT) (output from the shift register subcircuit 201 which has been inversed by two stages of inverters) is at a high level, and will be at low level after a further stage of inverter and input to the enable signal input subcircuit 301. Then, in one path, the signal will remain at low level and is input to the third transmission gate 3-1. In another path, the signal passes through the inverter 3-3 and become at high level before being input to the third transmission gate 3-1. At this time, the third transmission gate 3-1 is closed, and the enable input signals input from the port 8 cannot be output to the output subcircuit 401 via the third transmission gate 3-1 of the enable signal input subcircuit 301. High level of the signal turns on the N-type metal oxide transistor (NMOS) 3-2 of the enable signal input subcircuit 301, such that the output of the enable signal input subcircuit 301 is pulled down to the negative electric source input pin (VGL) of the low electric level LCD screen. Then the signal passes the three stages of inverters 4-4-1, 4-4-2, 4-4-3 of the output subcircuit 401 and become at high level, and further passes the a stage of inverter 4-4-4 and becomes at low level, and passes to the fourth transmission gate 4-1 and the fifth transmission gate 4-2 at the same time. At this time, the fourth transmission gate 4-1 is closed, and the fifth transmission gate 4-2 is opened. VCOM input from the port 11 is output to the output port 10 (OUT) of the output subcircuit 401 via the fifth transmission gate 4-2. At time T2, the input signal is at high level and is transmitted to the shift register subcircuit 201 via the first transmission gate 1-1 or the second transmission gate 1-2 (input to a first input port of the third NAND gate 2-3). The first clock signal which is at a high level is input to the first NAND gate 2-1 via port 7. The output from the output port of the second NAND gate 2-2 is at high level at time T1, and the output port of the second NAND gate 2-2 is connected to the second input port of the first NAND gate 2-1, therefore the signals output from the second NAND gate 2-2 is at a low level at time T2, and at this time the signals output from the shift register subcircuit 201 is at low level. The signals pass two stages of inverters and output as STV OUT which is at low level. The signals passes a further stage of inverter which turns the signal to high level and is input to the enable signal input subcircuit 301. Then, in one path, the signal maintains at high level and input to the third transmission gate 3-1, in another path the signal passes the inverter 3-3, become at low level and is input to the third transmission gate 3-1. The third transmission gate 3-1 is opened, the enable input signal passes through the third transmission gate 3-1 which output a pulse signal at high level. The pulse signal is output to the output subcircuit 401, passing through the three stages of inverters 4-4-1, 4-4-2, 4-4-3 and becoming at low level before being input to two transmission gates 4-1, 4-2. The signal passing through the three stages of inverters 4-4-1, 4-4-2, 4-4-3 also passes a further stage of inverter 4-4-4, become at high level and is input to the two transmission gates 4-1, 4-2. At this time, the fourth transmission gate 4-1 is opened, the fifth transmission gate 4-2 is closed, and output signal (touch scanning signal) is output.

According to an embodiment of the present disclosure, each group of the output signal may comprise two or more high frequency pulse signals. Signals output from the touch driving circuit is input to an emission electrode of the touch panel. A reception electrode takes sampling according to the variation of the signals of the emission electrode, and then the sampled signal is input to the touch integrated circuit for procession.

In another aspect, a touch panel is provided according to an embodiment of the present disclosure, including a touch driving circuit. The touch driving circuit comprises:

An input subcircuit, a shift register subcircuit, an enable signal input subcircuit and an output subcircuit.

The input subcircuit is configured to input an input signal which scans forward or backward.

Optionally, the input subcircuit according to an embodiment of the present disclosure may comprise a first transmission gate and a second transmission gate.

It should be noted that the above components of the input subcircuit is an optional embodiment according to the present disclosure. Any circuit structure that can realize the input of the input signal scanning forward or backward may be adopted in the embodiments of the present disclosure.

Optionally, the input subcircuit is configured to
transmit the input signal which scans forward via the first transmission gate in case of forward scanning; and
transmit the input signal which scans backward via the second transmission gate in case of backward scanning,
the input signal is effective at a low electric level.

It should be noted that in the embodiment of the present disclosure, the input signal is effective at low electric level. This is helpful in reducing power consumption of the touch driving circuit.

The shift register subcircuit is configured to shift register the input signal to generate an output control signal.

Optionally, the shift register subcircuit according to an embodiment of the present disclosure is consisted of two groups of NAND gates that are connected in an end-to-end fashion.

The enable signal input subcircuit is configured to control the output of the output enable signal of the integrated circuit according to the electric level of the output control signal.

Optionally, the enable signal input subcircuit according to an embodiment of the present disclosure comprises a third transmission gate, an N-type metal oxide transistor and an inverter. The inverter can control the N-type metal oxide transistor according to the output control signal output from the shift register subcircuit. The output of the third transmission gate will be pulled down to the negative electric source pin of the low electric level LCD screen.

Optionally, the enable signal input subcircuit is configured to control the close state and the open state of the third transmission gate according to the output control signal output from the shift registered subcircuit and processed by an inverter; and to control the output enable signal of the integrated circuit to be at high or low electric level based on the open state or the close state of the third transmission gate.

The output subcircuit is configured to output a corresponding output signal according to the electric level of the output enable signal.

Optionally, the output subcircuit according to an embodiment of the present disclosure comprises four inverters, a fourth transmission gate, a fifth transmission gate and an AND gate.

Optionally, the output subcircuit according to an embodiment of the present disclosure may be configured to
perform AND operation on the output enable signal and the integrated circuit signal via the AND gate. In case the output enable signal is at high level, the output signal is output. In case the output enable signal is at low level, a reference voltage (VCOM) signal for deflection of liquid crystal molecules is output.

In the embodiments of the present disclosure, a part of the work which is originally done inside the integrated circuit is transferred to the display screen. Therefore, the usage rate of the integrated circuit is reduced.

Comparing with related arts, a technical solution according to an embodiment of the present disclosure comprises an input subcircuit, a shift register subcircuit, an enable signal input subcircuit and an output subcircuit. The input subcircuit is configured to input an input signal which scans forward or backward. The shift register subcircuit is configured to shift register the input signal to generate an output control signal. The enable signal input subcircuit is configured to control the output of the output enable signal of the integrated circuit according to the electric level of the output control signal. The output subcircuit is configured to output a corresponding output signal according to the electric level of the output enable signal. The embodiments of the present disclosure realize a touch driving circuit with reduced usage of the integrated circuit.

In a further aspect, a display device according to an embodiment of the present disclosure is provided, including the above touch panel. The touch panel comprises a touch driving circuit which includes an input subcircuit, a shift register subcircuit, an enable signal input subcircuit and an output subcircuit.

The input subcircuit is configured to input an input signal which scans forward or backward.

Optionally, the input subcircuit according to an embodiment of the present disclosure may comprise a first transmission gate and a second transmission gate.

It should be noted that the above components of the input subcircuit is an optional embodiment according to the present disclosure. Any circuit structure that can realize the input of the input signal scanning forward or backward may be adopted in the embodiments of the present disclosure.

Optionally, the input subcircuit is configured to
transmit the input signal which scans forward via the first transmission gate in case of forward scanning; and
transmit the input signal which scans backward via the second transmission gate in case of backward scanning,
the input signal is effective at a low electric level.

It should be noted that in the embodiment of the present disclosure, the input signal is effective at low electric level. This is helpful in reducing power consumption of the touch driving circuit.

The shift register subcircuit is configured to shift register the input signal to generate an output control signal.

Optionally, the shift register subcircuit according to an embodiment of the present disclosure is consisted of two groups of NAND gates that are connected in an end-to-end fashion.

The enable signal input subcircuit is configured to control the output of the output enable signal of the integrated circuit according to the electric level of the output control signal.

Optionally, the enable signal input subcircuit according to an embodiment of the present disclosure comprises a third transmission gate, an N-type metal oxide transistor and an inverter.

Optionally, the enable signal input subcircuit is configured to control the close state and the open state of the third transmission gate according to the output control signal output from the shift registered subcircuit and processed by an inverter; and to control the output enable signal of the integrated circuit to be at high or low electric level based on the open state or the close state of the third transmission gate.

The output subcircuit is configured to output a corresponding output signal according to the electric level of the output enable signal.

Optionally, the output subcircuit according to an embodiment of the present disclosure comprises four inverters, a fourth transmission gate, a fifth transmission gate and an AND gate.

Optionally, the output subcircuit according to an embodiment of the present disclosure may be configured to
perform AND operation on the input signal and the integrated circuit signal via the output enable signal. In case the output enable signal is at high level, the output signal is output. In case the output enable signal is at low level, a reference voltage (VCOM) signal for deflection of liquid crystal molecules is output.

In the embodiments of the present disclosure, a part of the work which is originally done inside the integrated circuit is transferred onto the display screen. Therefore, the usage rate of the integrated circuit is reduced.

Comparing with related arts, a technical solution according to an embodiment of the present disclosure comprises an input subcircuit, a shift register subcircuit, an enable signal input subcircuit and an output subcircuit. The input subcircuit is configured to input an input signal which scans forward or backward. The shift register subcircuit is configured to shift register the input signal to generate an output control signal. The enable signal input subcircuit is configured to control the output of the output enable signal of the integrated circuit according to the electric level of the output control signal. The output subcircuit is configured to output a corresponding output signal according to the electric level of the output enable signal. The embodiments of the present disclosure realize a touch driving circuit with reduced usage of the integrated circuit.

It should be understood for a skilled person in the art, that all or a part of the steps of the above method can be performed by a program instructing corresponding a hardware (such as a processor). The program can be stored in a computer readable storage medium, such as a read-only memory, a magnetic disc or an optical disc. Optionally, all or a part of the steps of the above embodiments can be realized by hardware, such as realizing corresponding functions by an integrated circuit, or can be realized by software functional modules, such as realizing corresponding functions by a processor executing program/instruction stored in a memory. The present disclosure is not limited to any specific forms combination of hardware and software.

Although the embodiments of the present disclosure have been described above, these contents are only embodiments for understanding the present disclosure, and are not intended to limit the present disclosure. Any skilled person in the art may perform any modifications or variations based on the disclosure of the embodiment without departing from the spirit and scope of the present disclosure. The scope of protection of the present disclosure is determined by the scope of the claims.

What is a claimed is:

1. A touch driving circuit for driving a touch panel, comprising:
   an input subcircuit, configured to receive an input signal which scans forward or backward;
   a shift register subcircuit, configured to shift register the input signal to generate an output control signal;
   an enable signal input subcircuit, configured to control an output of an output enable signal of an integrated circuit according to the output control signal; and
   an output subcircuit, configured to output a corresponding output signal for driving the touch panel according to the output enable signal,
   wherein the shift register subcircuit comprises a first group of NAND gates and a second group of NAND gates that are connected in an end-to-end fashion,
   the first group of NAND gates comprises a first NAND gate and a second NAND gate, the second group of NAND gates comprises a third NAND gate and a fourth NAND gate,
   an input end of the first NAND gate is connected to a clock signal, another input end of the first NAND gate is connected to an output end of the second NAND gate, an output end of the first NAND gate is connected to an input end of the second NAND gate, an input end of the fourth NAND gate and an output end of the shift register subcircuit, another input end of the second NAND gate is connected to an output end of the fourth NAND gate and an input end of the third NAND gate, another input end of the third NAND gate receives the input signal outputted from the input subcircuit, and an output end of the third NAND gate is connected to another input end of the fourth NAND gate.

2. The touch driving circuit according to claim 1, wherein the input subcircuit comprises:

a first transmission gate for receiving the input signal which scans forward; and a second transmission gate for receiving the input signal which scans backward.

3. The touch driving circuit according to claim 2, wherein the input subcircuit is configured to transmit the input signal which scans forward via the first transmission gate in case of forward scanning; and transmit the input signal which scans backward via the second transmission gate in case of backward scanning, wherein the input signal is effective at a low electric level.

4. The touch driving circuit according to claim 1, wherein the enable signal input subcircuit comprises: a third transmission gate, an N-type metal oxide transistor and an inverter, wherein the inverter controls the N-type metal oxide transistor according to an output control signal output from the shift register subcircuit, an output of the third transmission gate is pulled down to a negative electric source pin of a low electric level LCD screen when the N-type metal oxide transistor turns on.

5. The touch driving circuit according to claim 4, wherein the enable signal input subcircuit is configured to control a close state and an open state of the third transmission gate according to the output control signal output from the shift register subcircuit and processed by the inverter; and to control the output enable signal of an integrated circuit based on the close state or the open state of the third transmission gate.

6. The touch driving circuit according to claim 1, wherein the output subcircuit comprises four inverters, a fifth transmission gate, a fifth transmission gate and an AND gate.

7. The touch driving circuit according to claim 6, wherein the output subcircuit is configured to perform AND operation on the output enable signal and an integrated circuit signal via the AND gate, when the output enable signal is at high electric level, the output signal is output, and when the output enable signal is at low electric level, a reference voltage signal for deflection of liquid crystal molecules is output.

8. A touch panel, comprising a touch driving circuit according to claim 1.

9. A display device, comprising the touch panel according to claim 8.

* * * * *